(12) United States Patent
Yamagishi et al.

(10) Patent No.: US 7,342,087 B2
(45) Date of Patent: Mar. 11, 2008

(54) METHOD FOR PREVENTION OF INCREASE IN PARTICLES IN COPOLYMER FOR SEMICONDUCTOR RESIST

(75) Inventors: Takanori Yamagishi, Ichihara (JP); Kazuhiko Mizuno, Ichihara (JP)

(73) Assignee: Maruzen Petrochemical Co. Ltd., Tokyo (JP)

( * ) Notice: Subject to any disclaimer, the term of this patent is extended or adjusted under 35 U.S.C. 154(b) by 157 days.

(21) Appl. No.: 11/224,510

(22) Filed: Sep. 12, 2005

(65) Prior Publication Data

US 2006/0058433 A1    Mar. 16, 2006

(30) Foreign Application Priority Data

Sep. 14, 2004 (JP) .............................. 2004-266755

(51) Int. Cl.
*C08F 6/00* (2006.01)
(52) U.S. Cl. ........................ 528/480; 524/150; 525/82; 525/83; 525/84; 526/85

(58) Field of Classification Search ................. 524/160, 524/150; 526/82, 83, 84, 85; 525/82, 83, 525/84; 528/480
See application file for complete search history.

(56) References Cited

U.S. PATENT DOCUMENTS 6,641,670 B2 * 11/2003 Tsujii et al. ................ 118/610

* cited by examiner

*Primary Examiner*—Terressa Boykin
(74) *Attorney, Agent, or Firm*—Melvin I. Stoltz

(57) ABSTRACT

A method for prevention of increase in particles in copolymer for semiconductor resist, which comprises passing, through a filter containing a resin having an amino group and/or an amide bond a copolymer solution for semiconductor resist which contains a copolymer for semiconductor resist having a polar group-containing recurring unit and an alicyclic structure-containing recurring unit and which contains no ionic additive. With the method, there can be obtained a copolymer semiconductor resist, which can be suitably used in a resist film used for formation of a fine pattern in semiconductor production and which is very low in formation of particle s during storage and accordingly generates substantially no defect after development.

9 Claims, No Drawings

METHOD FOR PREVENTION OF INCREASE IN PARTICLES IN COPOLYMER FOR SEMICONDUCTOR RESIST

BACKGROUND OF THE INVENTION

1. Field of the Invention

The present invention relates to a method for prevention of increase in particles in copolymer for semiconductor resist, which is applied to a semiconductor resist suitably used for formation of a resist film used in semiconductor lithography.

2. Description of the Prior Art

In the lithography employed for production of semiconductor, formation of finer pattern is required with the increase in the integrity of semiconductor. A light source of shorter wavelength is essential for the finer pattern. Currently, a lithography using a crypton fluoride (KrF) excimer laser beam (wavelength: 248 nm) is becoming a main stream and a lithography giving a line width of 100 nm or less using an argon fluoride (ArF) excimer laser beam (wavelength: 193 nm) is being put to practical use. Further, short-wavelength radiation lithography techniques using a fluorine dimer ($F_2$) excimer laser beam (wavelength: 157 nm), an extreme ultraviolet light (EUV), an X-ray, an electron beam or the like are being developed.

In these semiconductor lithographies, there are used a resist film for forming a resist pattern (to be transferred onto a substrate) utilizing the film's property of change in solubility in alkali developing solution by the action of acid, and various coating films formed on or beneath the resist film. As the coating film formed beneath the resist film, i.e. the underlayer film, there can be mentioned, for example, an anti-reflection film used for suppressing the light reflected from a substrate and allowing for the precise formation of a fine resist pattern; a flattening film used as an underlayer film of resist in order to smoothen the surface unevenness of a pattern-formed substrate when another resist pattern is going to be formed on the substrate; and an underlayer film in a multi-layered resist, used for transferring a resist pattern by dry-etching.

These coating films are formed by dissolving a polymer for lithography (having the properties of an intended coating film) and additives, in an organic solvent to prepare a coating solution, coating the solution on a substrate by spin coating or the like, and as necessary applying a heat or the like to remove the solvent. The copolymer for lithography used needs to have optical and chemical properties required for resist film or anti-reflection film; physical properties such as coatability, adhesivity to substrate or underayer film, and the like; and basic properties to be possessed by a copolymer for coating film, such as no presence of dust which hinders formation of fine pattern.

As the copolymer used in the resist film, there are a negative type whose solubility in alkali developing solution decreases when an acid acts thereon, and a positive type whose solubility in alkali developing solution increases when an acid acts thereon. A positive type resist copolymer contains a recurring unit having a polar group by which the copolymer can have high adhesivity to semiconductor substrate or to underlayer film and can control solubility in organic solvent for resist or in alkali developing solution; a recurring unit having such a structure that a non-polar substituent is dissociated by the action of an acid to generate a polar group soluble in alkali developing solution (these two recurring units are essential); and, as necessary, a recurring unit having an acid-stable non-polar substituent by which the copolymer can control solubility in organic solvent for resist or in alkali developing solution.

As specific examples of the positive type resist copolymer, there are known, in KrF lithography, copolymers containing a recurring unit derived from hydroxystyrene and a recurring unit derived from an acid-decomposable alkoxystyrene; copolymers containing a recurring unit derived from hydroxystyrene and a recurring unit derived from an acid-decomposable alkyl (meth)acrylate; and polymers wherein part of the hydroxystyrene-derived recurring unit has been protected with an acetal. In ArF lithography, there are known, for example, copolymers containing a recurring unit derived from a (meth)acrylate substituted by a hydroxyalkyl group and a recurring unit derived from an acid-decomposable alkyl (meth)acrylate. As the resist pattern has become finer, there are coming to be used those resins wherein a highly hydrophobic alicyclic structure is introduced as an acid-dissociable group and a contrast of dissolution in alkali developing solution before and after dissociation is increased, or those resins wherein etching resistance or light transmittance is increased.

Meanwhile, in the semiconductor lithography, defects of resist pattern have an influence on the yield of the semiconductor produced; therefore, as the resist pattern has become finer, it is required to decrease even the fine defects. In particular, high-molecular compounds of extremely high molecular weight contained in a copolymer for resist in a very small amount (hereinafter, such compounds are referred to as high polymers) and compounds which are a compound containing recurring units having a polar group or an alicyclic structure and wherein the same recurring units are connected continuously to form a long chain (hereinafter, such compounds are referred to as long consecutive sequence), are hardly soluble in an organic solvent for resist or in an alkali developing solution. Such high polymers or long consecutive sequence, even if they are dissolved right after production of a resist solution containing a copolymer, tend to separate out, during the storage of the resist solution, as a foreign matter of very small particle diameter (hereinafter, the foreign matter is referred to as particles) (it is presumed that, in separating-out of the particles, an extremely small, hardly-soluble substance acts as a nucleus); therefore, there is a problem in that defects of resist pattern appear easily after development (hereinafter, these defects are referred to as defects after development) and the problem has been a big obstacle in obtaining a finer resist pattern.

As the method for removing the very small dust contained in a copolymer having an alicyclic structure, there is known, for example, a method (Patent Literature 1: JP-A-1999-231539) which comprises filtering, through a filter having a pore diameter of 0.1 µm or less, a resist composition obtained by dissolving a copolymer and a radiation-sensitive compound (e.g. a photo acid generator) in a solvent. With this method, the very small dust present at the time of filtering is removable; however, there has remained unachieved a task of reducing the particles which separate out with the passage of time during the storage of filtered resist composition.

Meanwhile, there is known a method (Patent Literature 2: JP-A-2001-350266) which comprises passing, through a filter having a positive zeta-potential, a resist composition obtained by dissolving a binder component (e.g. an alkali-soluble resin or a resin which becomes alkali-soluble by the action of an acid) and an acid-generating agent in a solvent, to produce a storage stability-superior resist composition which, even when stored for a long period and coated on a silicon wafer, gives a thin film free from any pin hole defect. However, when such a composition containing an acid-generating agent is passed through a filter having a positive zeta-potential, part of the ionic additive such as acid-generating agent or the like is captured by the filter having a positive zeta-potential; consequently, there has been a problem of a change in lithography properties (e.g. sensitivity) and the method is not practical. Further, probably because there is no sufficient capture of nucleic substance of particles which causes defects after development, there has been a problem in that it is impossible to reduce the particles which separate out with the passage of time during the storage of filtered resist composition.

As the method of passing a polymer solution for lithography containing no ionic additive, through a filter having a zeta-potential, there are known a method (Patent Literature 3: JP-A-1996-165313) which comprises passing a vinylphenol-based polymer dissolved in a solvent, through a filter which produces a zeta-potential in the presence of a cation-controlling agent, and a method (Patent Literature 4: JP-A-1998-237125) which comprise passing a vinylphenol-based polymer dissolved in a solvent through a filter containing an ion exchanger and/or a chelate-forming compound and a cation-controlling agent in combination or separately, to effectively reduce the metal impurities contained in a vinylphenol-based polymer dissolved in a solvent. With these methods, however, there has been no sufficient reduction in particles which cause a problem particularly in a copolymer having an alicyclic structure.

Some resist compositions show a change in sensitivity with the passage of time. As the method for removing a substance which causes such a sensitivity change, there are known a method (Patent Literature 5: JP-A-2001-125269) which comprises filtering a resist solution containing an acid-degradable resin and an acid-generating agent through a filter containing a polyethylene, a nylon or a polysulfone, and a method (Patent Literature 6: JP-A-2003-330202) which comprises filtering a resin of alicyclic (monocyclic or polycyclic) hydrocarbon structure whose solubility in alkali developing solution increases when an acid acts thereon, through an ion exchange filter and/or an undissolved colloid-removing filter. With these methods, the sensitivity change is suppressed; however, the effect for removal of nucleic substance (hardly-soluble dust) is unclear and the problem of dust generation with the passage of time during storage remains undissolved.

SUMMARY OF THE INVENTION

The present invention has been made in view of the above situation and aims at providing a method for prevention of increase in particles in copolymer for semiconductor resist, capable of producing a copolymer for semiconductor resist which can be suitably used in a resist film used for formation of a fine pattern in semiconductor production and which is very low in formation of particles during storage and accordingly generates substantially no defect after development.

In order to achieve the above aim, the present invention provides a method for prevention of increase in particles in copolymer for semiconductor resist, which comprises passing, through a filter containing a resin having an amino group and/or an amide bond, a copolymer solution for semiconductor resist which contains a copolymer for semiconductor resist having a polar group-containing recurring unit and a recurring unit having an alicyclic structure and which contains no ionic additive.

In order to achieve the above aim, the present invention also provides a method for prevention of increase in particles in copolymer for semiconductor resist, which comprises subjecting a copolymer solution for semiconductor resist which contains a copolymer for semiconductor resist having a polar group-containing recurring unit and a recurring unit having an alicyclic structure and which contains no ionic additive, to:

a step of passing the copolymer solution through a filter having an amino group and/or an amide bond, and a step of passing the copolymer solution through a filter containing a polyamide resin.

According to the present invention, there can be provided a method for prevention of increase in particles in copolymer for semiconductor resist, which allows for production of a semiconductor resist capable of suppressing particles separation occurring with the passage of time when stored for a long period and which can be carried out easily.

DETAILED DESCRIPTION OF THE INVENTION

The copolymer for semiconductor resist, to which the present invention is applied, contains, as an essential component, a recurring unit (A) having a polar group by which the copolymer can have high adhesivity to semiconductor substrate or to underlayer film and can control the solubility in organic solvent for resist or in alkali developing solution; when the copolymer is, for example, a copolymer for positive resist, further contains a recurring unit (B) having a structure that is decomposed by an acid to generate an alkali-soluble substituent; as necessary, further contains a recurring unit (C) having a non-polar structure that can control the solubility in solvent for resist as well as in alkali developing solution. In the copolymer, any one or all of the recurring units (A), (B) and (C) have an alicyclic structure.

The recurring unit (A) having a polar group by which the copolymer can control the adhesivity and the solubility, can be introduced by copolymerizing a monomer having a polar group. As such a monomer, there can be mentioned, for example, (1) hydroxystyrene; (2) hydroxyfluoroalkylstyrene; (3) carboxylic acid having ethylenic double bond; (4) hydroxyalkyl ester of (3); (5) hydroxyl group-containing compound such as hydroxyfluoroalkyl ester of (3); (6) compound obtained by substitution of a substituent having a polar group such as lactone, acid anhydride, amide, imide, nitrile, carbonate, epoxy or the like, for the hydroxyl group of the above-mentioned hydroxyl group-containing compound; and (7) polar group-containing polymerizable compound such as maleic anhydride, maleimide or the like.

As specific examples of the above-mentioned hydroxyl group-containing compound (monomer), there can be mentioned (1) hydroxystyrenes such as p-hydroxystyrene, m-hydroxystyrene, p-hydroxy-α-methylstyrene and the like; (2) hydroxyfluoroalkylstyrenes such as p-(2-hydroxy-1,1,1,3,3,3-hexafluoro-2-propyl)styrene and the like; (3) ethylenic double bond-containing carboxylic acids such as acrylic acid, methacrylic acid, maleic acid, fumaric acid, α-trifluoromethylacrylic acid and the like, and ethylenic double bond-containing carboxylic acids of alicyclic structure, such as 5-norbornene-2-carboxylic acid, 2-trifluoromethyl-5-norbornene-2-carboxylic acid, carboxytetracyclo[4.4.0.1$^{2,5}$.1$^{7,10}$]dodecyl methacrylate and the like; (4) hydroxyalkyl esters which are obtained by substitution of ethylenic double bond-containing carboxylic acid of (3) by hydroxyalkyl group (e.g. hydroxymethyl group, hydroxyethyl group or hydroxypropyl group), hydroxyalkyl group of alicyclic structure (e.g. hydroxy-8-tricyclo[5.2.1.0$^{2,6}$]decanyl group or 3-hydroxy-1-adamantyl group) or the like; (5) hydroxyfluoroalkyl esters which are obtained by substitution of ethylenic double bond-containing carboxylic acid of (3) by hydroxyfluoroalkyl group [e.g. 2-hydroxy-1,1,1,3,3,3-hexafluoro-2-propyl)methyl group], hydroxyfluoroalkyl group of alicyclic structure [e.g. 5-(2-hydroxy-1,1,1,3,3,3-hexafluoro-2-propyl)methyl-2-norbonyl group, 5-(2-hydroxy-1,1,1,3,3,3-hexafluoro-2-propyl)methyl-3-norbornyl group, 5-(2-hydroxy-1,1,1,3,3,3-hexafluoro-2-propyl)-2-norbornyl group or 2-(4-(2-hydroxy-1,1,1,3,3,3-hexafluoro-2-propyl)cyclohexyl)-1,1,1,3,3,3-hexafluoropropyl group] or the like.

As the monomers having a polar group other than hydroxyl group, there can be mentioned (6) compounds obtained by substitution of a substituent having a polar group such as lactone, acid anhydride, imide, nitrile, carbonate, epoxy or the like, for the hydroxyl group of a hydroxyl group-containing monomer mentioned in the above (1) to (5); and (7) polar group-containing polymerizable compounds such as maleic anhydride, maleimide and the like.

Particularly preferred as the polar substituent mentioned in the above (6) is a substituent containing a lactone structure; and there can be mentioned, for example, substituents of lactone structure such as γ-butyrolactone, γ-valerolactone, δ-valerolactone, mevalonic acid δ-lactone and the like, and substituents of alicyclic lactone structure such as 1,3-cyclohexanecarbolactone, 2,6-norbornanecarbolactone, 4-oxatricyclo[5.2.1.0$^{2,6}$]decan-3-one and the like. As the compounds obtained by substitution for the hydroxyl group of a hydroxyl group-containing monomer mentioned in the above (1) to (5), there can be mentioned ester compounds obtained by substitution of the above-mentioned substituent for an ethylenic double bond-containing carboxylic acid such as acrylic acid, methacrylic acid, maleic acid, fumaric acid, α-trifluoromethylacrylic acid, 5-norbornene-2-carboxylic acid, 2-trifluoromethyl-5-norbornene-2-carboxylic acid, carboxytetracyclo[4.4.0.1$^{2,5}$.1$^{7,10}$]dodecyl methacrylate or the like.

Meanwhile, the recurring unit (B) having a structure that is decomposed by an acid to generate an alkali-soluble substituent, means a structure ordinarily used as a resist and can be obtained by polymerizing a monomer having a structure wherein an alkali-soluble group is protected by an acid-dissociable substituent, or by polymerizing a monomer having an alkali-soluble structure and then protecting the alkali-soluble group by an acid-dissociable group.

As the acid-dissociable group, there can be mentioned, for example, alkyl groups such as tert-butyl group, tert-amyl group and the like; alkyl groups of alicyclic structure such as 1-methyl-1-cyclopentyl group, 1-ethyl-1-cyclopentyl group, 1-methyl-1-cyclohexyl group, 1-ethyl-1-cyclohexyl group, 2-methyl-2-adamantyl group, 2-ethyl-2-adamantyl group, 2-propyl-2-adamantyl group, 2-(1-adamantyl)-2-propyl group, 8-methyl-8-tricyclo[5.2.1.0$^{2,6}$]decanyl group, 8-ethyl-8-tricyclo[5.2.1.0$^{2,6}$]decanyl group, 8-methyl-8-tetracyclo[4.4.0.1$^{2,5}$.1$^{7,10}$]dodecanyl group, 8-ethyl-8-tetracyclo[4.4.0.1$^{2,5}$.1$^{7,10}$]dodecanyl group and the like; oxygen-containing alkyl groups such as 1-methoxyethyl group, 1-ethoxyethyl group, 1-iso-propoxyethyl group, 1-n-butoxyethyl group, 1-tert-butoxyethyl group, methoxymethyl group, ethoxymethyl group, iso-propoxymethyl group, n-butoxymethyl group, tert-butoxymethyl group, tert-butoxycarbonyl group and the like; and oxygen-containing hydrocarbon groups of alicyclic structure such as 1-cyclopentyloxyethyl group, 1-cyclohexyloxyethyl group, 1-tricyclo[5.2.1.0$^{2,6}$]decanyloxyethyl group, cyclopentyloxymethyl group, cyclohexyloxymethyl group, tricyclo[5.2.1.0$^{2,6}$]decanyloxymethyl group and the like.

As the monomer having such an acid-dissociable group, there can be mentioned, for example, compounds obtained by protecting the hydroxyl group of any one compound shown in (1) to (5) of the recurring unit (A), by an acid-dissociable group. When a monomer having an unprotected alkali-soluble group is polymerized and then the alkali-soluble group is protected by an acid-dissociable group, such a monomer having an acid-dissociable group can be obtained by polymerizing a polymerizable compound having an alkali-soluble group and then reacting the polymer obtained, with a compound (e.g. vinyl ether or halogenated alkyl ether) capable of generating an acid-dissociable group in the presence of an acid catalyst. As the acid catalyst used in the reaction, there can be mentioned p-toluenesulfonic acid, trifluoroacetic acid, strongly acidic ion exchange resin, etc.

As the monomer capable of giving a recurring unit (C) (which can be contained as necessary) having an acid-stable, non-polar substituent which can control solubility in organic solvent for resist as well as in alkali developing solution, there can be mentioned, for example, compounds wherein ethylenic double bond is bonded with a substituted or unsubstituted aryl group containing no polar group, and compounds obtained by substituting an acid-stable non-polar group for the hydroxyl group of any compound shown in (1) and (2) of the recurring unit (A). As specific examples of the monomer, there can be mentioned ethylenic double bond-containing aromatic compounds such as styrene, α-methylstyrene, p-methylstyrene, indene and the like; ester compounds wherein an ethylenic double bond-containing carboxylic acid (e.g. acrylic acid, methacrylic acid, trifluoromethylacrylic acid, norbornenecarboxylic acid, 2-trifluoromethylnorbornenecarboxylic acid or carboxytetracyclo[4.4.0.1$^{2,5}$.1$^{7,10}$]dodecyl methacrylate) is substituted by a non-polar, acid-stable group; and ethylenic double bond-containing, alicyclic hydrocarbon compounds such as norbornene, tetracyclododecene and the like. As examples of the above-mentioned non-polar, acid-stable group for substitution of carboxylic acid for ester formation, there can be mentioned straight-chain or branched-chain alkyl groups such as methyl group, ethyl group, isopropyl group and the like; and alkyl groups of alicyclic structure such as cyclopentyl group, cyclohexyl group, isobornyl group, tricyclo[5.2.1.0$^{2,6}$]decanyl group, 2-adamantyl group, tetracyclo[4.4.0.1$^{2,5}$.1$^{7,10}$]dodecyl group and the like.

At least one kind of these monomers can be used for each of the recurring units (A), (B) and (C). The ratio of these recurring units in the resist polymer obtained can be selected so that the basic properties of resist are not impaired.

In the case of, for example, the copolymer for positive resist, the proportion of the recurring unit (A) is, in general, preferably 30 to 90 mol %, more preferably 40 to 90 mol %. With respect to the monomer units having the same polar group, the proportion of the recurring unit (A) is preferably 70 mol % or less. The proportion of the recurring unit (B) is preferably 10 to 70 mol %, more preferably 10 to 60 mol %. The proportion of the recurring unit (C) is preferably 0 to 50 mol %, more preferably 0 to 40 mol %.

As to the method for production of the copolymer for semiconductor resist, the copolymer is preferably obtained by radical-polymerizing at least two kinds of polymerizable compounds selected from the above-mentioned monomer group, in a polymerization solvent using a polymerization initiator and, as necessary, a chain transfer agent.

As to the polymerization initiator used in the polymerization reaction, there is no particular restriction as long as it is a compound generally used as a radical-generating agent. There can be used, singly or in admixture, for example, azo compounds such as 2,2'-azobisisobutyronitrile, 2,2'-azobis(2-methylbutyronitrile), dimethyl 2,2'-azobisisobutyrate, 1,1'-azobis(cyclohexane-1-carbonitrile), 4,4'-azobis(4-cyanovaleric acid) and the like; and organic peroxides such as decanoyl peroxide, lauroyl peroxide, benzoyl peroxide, bis(3,5,5-trimethylhexanoyl) peroxide, succinic acid peroxide, tert-butyl peroxy-2-ethylhexanoate and the like.

The use amounts of the polymerization initiator and the chain transfer agent differ depending upon the kinds of the raw material monomers, polymerization initiator and chain transfer agent used in the polymerization reaction and the production conditions such as polymerization temperature, polymerization solvent, polymerization method, purification conditions and the like; therefore, the use amounts can not be specified in particular ranges. However, the polymerization initiator and the chain transfer agent are used in the most appropriate amounts in order to allow the obtained copolymer to have an intended molecular weight. In general, when the weight-average molecular weight of the copolymer obtained is too high, the copolymer is low in solubility in the solvent used in formation of coating film or in alkali developing solution. Meanwhile, when the weight-average molecular weight of the copolymer obtained is too low, the coating film formed is inferior in properties. Therefore, the weight-average molecular weight is controlled preferably in a range of 2,000 to 40,000, more preferably in a range of 3,000 to 30,000.

The polymerization reaction can be carried out, for example, by a so-called mixture polymerization method wherein all monomers, a polymerization initiator and, as necessary, a chain transfer agent are dissolved in a polymerization solvent and heated to a polymerization temperature; an initiator addition method wherein monomers are dissolved in a solvent and heated to a polymerization temperature, followed by addition of a polymerization initiator; and a so-called dropping polymerization method wherein monomers, a polymerization initiator and a chain transfer agent are dropped, partially or in a total mixture or separately, into a polymerization system heated to a polymerization temperature. Of these methods, the dropping polymerization method is preferred because it can make small the difference between production lots, and there is particularly preferred a method wherein monomers and a polymerization initiator are each dropped separately because the stability of each monomer can be maintained during the dropping.

As to the solvent used in the polymerization reaction, there is no particular restriction as long as it is a solvent capable of stably dissolving the raw material monomers, the copolymer obtained, the polymerization initiator and the chain transfer agent. As specific examples of the polymerization solvent, there can be mentioned ketones such as acetone, methyl ethyl ketone, methyl amyl ketone, cyclohexanone and the like; ethers such as tetrahydrofuran, dioxane, glyme, propylene glycol monomethyl ether and the like; esters such as ethyl acetate, ethyl lactate and the like; ether esters such as propylene glycol methyl ether acetate and the like; and lactones such as γ-butyrolactone and the like. These solvents can be used singly or in admixture. As to the use amount of the polymerization solvent, there is no particular restriction; however, it is generally 0.5 to 20 parts by weight, preferably 1 to 10 parts by weight relative to 1 part by weight of the monomers. When the use amount of the solvent is too small, there arises separating-out of the monomers or too high a viscosity, which may make the polymerization system non-uniform. When the use amount is too large, there is a case that the conversion of monomers is insufficient or the molecular weight of the copolymer obtained has no intended high level.

There is no particular restriction as to the conditions of polymerization reaction. However, the reaction temperature is generally preferred to be about 40 to 100° C., and the polymerization temperature need be strictly controlled in order to make small the difference between production lots of copolymer and is controlled preferably in a range of set temperature ±1° C. As to the reaction time, a longer dropping time is preferred in the case of dropping polymerization, because it can maintain the composition and concentrations of monomers and concentration of radical in polymerization system, at constant levels and thereby can make uniform the composition and molecular weight of polymer produced during dropping. However, too long a dropping time is not preferred from the standpoints of production efficiency per hour and stability of monomers in dropping solution. Therefore, the dropping time is selected in a range of 0.5 to 20 hours, preferably 1 to 10 hours. After completion of the dropping, it is preferred to conduct aging for a given time with the polymerization temperature being maintained, because the unreacted monomers remain. The aging time is selected within 8 hours, preferably in a range of 1 to 6 hours; in the case of mixture polymerization, the aging time after arrival of the polymerization temperature is selected in a range of 1 to 24 hours, preferably 2 to 12 hours.

The copolymer obtained contains low-molecular weight impurities such as unreacted monomers, oligomers, polymerization initiator, chain transfer agent, by-products (reaction products thereof) and the like. These impurities need be removed by a purification step. The purification step is conducted specifically by diluting, as necessary, the polymerization reaction mixture using a good solvent, contacting the diluted reaction mixture with a poor solvent to separate out a copolymer as a solid and extract impurities into a poor solvent phase (hereinafter, this is referred to as reprecipitation), or by conducting separation of two liquid phases and extracting impurities into a poor solvent phase. When reprecipitation is conducted, further purification can be made by a step of separating the separated solid from the poor solvent by filtration, decantation or the like, re-dissolving the resulting solid in a good solvent, and adding a poor solvent thereto to give rise to reprecipitation, or by a step of washing the separated solid using a poor solvent. When liquid-liquid two-phase separation is conducted, further precipitation can be made by separating the poor solvent phase by phase separation, adding a poor solvent to the copolymer solution obtained, to give rise to reprecipitation or liquid-liquid two-phase separation. These operations may be conducted by repeating the same operation or combining different operations.

As the poor solvent used in the purification step, there can be mentioned water; hydroxyl group-containing compounds such as methanol, ethanol, isopropanol, ethylene glycol, ethyl lactate and the like; straight-chain, branched chain or cyclic saturated hydrocarbons such as pentane, n-hexane, iso-hexane, n-heptane, cyclopentane, ethylcyclohexane and the like; and aromatic hydrocarbons such as toluene, xylene and the like. These solvents can be used singly or in admixture. As the good solvent, there can be mentioned, for example, the above-mentioned polymerization solvents and he solvents shown for the later-described solvent for coating film formation. A mixed use of a poor solvent and a good solvent is possible.

There is no particular restriction as to the kind and amount of the poor solvent used in the purification step, as long as the copolymer and the low-molecular weight compounds can be separated from each other. However, the kind and amount of the poor solvent can be appropriately selected depending upon, for example, the solubility of copolymer in poor solvent, the kind and amount of solvent used in polymerization, and the kind and amount of impurities. The amount of the poor solvent is generally 0.5 to 50 times, preferably 1 to 20 times, more preferably 2 to 10 times the total weight of the polymerization reaction mixture as necessary diluted with a good solvent. In any case, when the use amount of the solvent is small, separation of impurities [unreacted monomers, polymerization initiator, chain transfer agent and by-products (reaction products thereof)] becomes insufficient. On the other hand, when the use amount is too large, the amount of the waste solution is large, which is not preferred from the standpoints of operation and cost.

The temperature in the purification step need be controlled strictly because it has a large influence on, for example, the molecular weight and molecular weight distribution of copolymer for semiconductor resist, the recovery ratio of impurities (e.g. residual monomers and initiator residue), and the properties in lithography. When the temperature in the purification step is too low, the solubility of impurities in reprecipitation solvent or in washing solvent becomes insufficient and the removal of impurities becomes insufficient, making the purification inefficient. On the other hand, when the temperature in the purification step is too high, the copolymer dissolves in the reprecipitation solvent or in the washing solvent, which incurs disturbance of composition balance of copolymer in low-molecular weight region or a reduced yield. Therefore, too low or too high a temperature in the purification step is not preferred. Hence, the purification step is conducted in a temperature range of preferably 0 to 40° C., more preferably 0 to 30° C.

The copolymer after purification is dried and can be taken out as a powder. Or, it is re-dissolved in a good solvent before or after being dried, and can be taken as a solution. As the good solvent used in re-dissolution, there can be used, for example, the above-mentioned polymerization solvents or the solvents shown for the later-described solvent for coating film formation.

When the copolymer after purification is taken out as a powder, it is dissolved in a solvent for coating film formation; when the copolymer after purification is taken out as a solution, the low-boiling impurities (e.g. the other solvent used for purification) are distilled off under reduced pressure while a solvent for coating film formation is being fed as necessary; in a way such as mentioned above, the copolymer after purification can be converted into a solution for coating film formation. The solvent for coating film formation is not particularly restricted as long as it can dissolve the copolymer; however, it is selected ordinarily by considering the boiling point, the influence on semiconductor substrate and other coating films, and the absorption of radiation used in lithography. As examples of the solvent ordinarily used for coating film formation, there can be mentioned propylene glycol methyl ether acetate, ethyl lactate, propylene glycol monomethyl ether, methyl amyl ketone, γ-butyrolactone and cyclohexanone. The use amount of the solvent is not particularly restricted but is ordinarily in a range of 1 to 20 parts by weight per 1 part of the copolymer.

In the present invention, to the copolymer solution for semiconductor resist, obtained as above and containing no ionic additive is applied the method of the present invention for prevention of increase in particles in copolymer for semiconductor resist, by passing the copolymer solution through a filter containing a resin having amino group and/or amide bond, for example, in at least one step from polymerization to before addition of ionic compound (e.g. photpacid generator), preferably in at least one step from purification to before addition of ionic compound (e.g. photo-acid generator).

As the filter containing a resin having amino group and/or amide bond, there can be mentioned, for example, (1) a filter containing a polyamide resin such as nylon 66, nylon 6, nylon 46 or the like, and (2) a filter containing a resin having a positive zeta-potential, obtained by reacting a polyamine with a reactive compound (e.g. a dicarboxylic acid) (the resin is exemplified by a polyamide-polyamine epichlorohydrin cationic resin). As the filter (2), there can be mentioned, for example, (2-a) a filter obtained by loading, on a fiber, a resin having a positive zeta-potential, together with a filtering aid such as diatomaceous earth, cellulose or the like, and (2-b) a filter modified by a resin having a positive zeta-potential, on a filter made of other resin such as polyamide resin or the like.

With respect to the commercial products of the filter having amino group and/or amide bond, there can be mentioned, for example, membrane filters such as Ultipleat P-Nylon, Ultipor N 66 (these are products of Nihon Pall Ltd.) and the like, as examples of the filter (1); Zeta Plus (a product of Cuno K.K.), SEITZ Depth Filter (a product of Nihon Pall Ltd.), etc. as examples of the filter (2-a); and Electropore (a product of Cuno K.K.), etc. (these are membrane filters) as examples of the filter (2-b).

In the present invention, it is preferred to pass the copolymer solution for semiconductor resist through both of the filter (1) containing a polyamide resin and the filter (2) containing a resin having a positive zeta-potential. The filter such as the above-mentioned Electropore of Cuno, obtained by coating, on a polyamide resin, a resin having a positive zeta-potential and obtained by reacting a polyamine with a reactive compound (e.g. a dicarboxylic acid), is particularly preferable because it has both of the function of filter (1) and the function of filter (2).

The pore diameter of the filter is preferably 0.1 μm or less, particularly preferably 0.05 μm or less, in order to remove a nucleating substance for particles and dusts. The filter (2) containing a resin having a positive zeta-potential can remove the nucleating substance for particles if it has a pore diameter of 0.5 μm or less, preferably 0.2 μm or less; however, in order to remove the dusts, it is preferred to first pass the copolymer solution for semiconductor resist through the filter (2) and then pass through a filter having a pore diameter of 0.1 μm or less, particularly 0.05 μm or less (there is no restriction as to the material of the latter filter). Incidentally, the pore diameter of the filter containing a resin having a zeta-potential is more preferably 0.1 μm or less, particularly preferably 0.05 μm or less, because a large pore diameter is low in capture of the nucleating substance for particles. The pore diameter mentioned here is a nominal pore diameter by filter manufacturer.

Incidentally, the copolymer solution for semiconductor resist may be contacted with a resin having ion exchangeability, prior to being passed through the above-mentioned filter(s), and the filter containing a resin having amino group and/or amide bond may contain a functional group having ion exchangeability.

In the copolymer of the present invention for semiconductor resist, obtained by passing through the above-mentioned filter(s), separation of particles occurring with the passage of time during the long-term storage of the copolymer is suppressed and, after 3-month storage, the number of particles having pore diameters of 0.2 μm or more is, for example, 20 or less per ml.

By using such a copolymer for semiconductor resist, capable of suppressing the separation of particles occurring with the passage of time during long-term storage, it is possible to reduce the defects of semiconductor pattern, increase its yield, and produce a semiconductor pattern of stable quality.

Meanwhile, when the above-obtained copolymer for semiconductor resist is made into a composition for semiconductor resist, there are added, to the copolymer, a radiation-sensitive, acid-generating agent; an acid diffusion-preventing agent (e.g. a nitrogen-containing compound) for prevention of acid diffusion into portion not exposed to radiation; etc. As the radiation-sensitive, acid-generating agent, there can be used those compounds ordinarily used as a raw material for resist, such as onium salt compound, sulfone compound, sulfonic acid ester compound, sulfonimide compound, disulfonyldiazomethane compound and the like.

The composition for semiconductor resist can further contain, as necessary, compounds ordinarily used as additives for resist, such as dissolution-preventing agent, sensitizer, dye and the like. As to the proportions of the components (excluding resist solvent) in the resist composition, there is no particular restriction. However, they are selected in ranges of 5 to 50% by mass (polymer concentration), 0.1 to 10% by mass (radiation-sensitive, acid-generating agent), and 0.001 to 10% by mass (acid diffusion-preventing agent).

EXAMPLES

Next, the present invention is described in more detail by way of Examples. However, the present invention is in no way restricted to these Examples. Incidentally, the composition of each copolymer obtained was determined from the result of measurement by $^{13}$C-NMR. The weight-average molecular weight Mw and poly-dispersity Mw/Mn of the copolymer were determined from the result of measurement by gel permeation chromatography (GPC). The number of particles in resist composition was measured using an in-solution particle counter. The methods for measurement are described below.

(1) Composition of Copolymer 10 parts by weight of a copolymer and 1 part by weight of acetyl acetonate were dissolved in 20 parts by weight of deuterated acetone to prepare a sample solution. The sample solution was placed in an NMR tube and analyzed using a $^{13}$NMR apparatus (a product of Bruker, 400 MHz).

(2) Mw and Mw/Mn of Copolymer 4 parts by weight of a copolymer was dissolved in 100 parts by weight of tetrahydrofuran (hereinafter, abbreviated to THF) to prepare a sample solution. 20 μl of the sample solution was poured into a GPC apparatus (GPC 8220 produced by Tosoh Corporation) provided with 4 GPC columns (KF-804L produced by Showa Denko K.K.), with THF being used as an elutant. The elute was examined using a differential refractive index (RI) detector. Mw and Mw/Mn were calculated based on the calibration curves beforehand prepared using a standard polystyrene.

(3) Number of Particles in Resist Composition

To a 15% by weight PGMEA solution comprising 60 parts by weight of a copolymer and 360 parts by weight of propylene glycol monoethyl ether acetate (hereinafter, abbreviated to "PGMEA") were added 1.0 part by weight of trifluoro-methanesulfonic acid triphenylsulfonium (a photo acid generator) and 0.1 part of triethanolamine, and they were made into a solution. The solution was filtered through Optimizer D (a product of Nihon Microlysis, a polyethylene-made membrane filter having a pore diameter of 0.05 μm) to prepare a resist composition. The resist composition was divided into two portions. They were measured for the number of the particles present in 1 ml of the composition, having sizes of 0.2 μm or more, using In-Solution Particle Counter KS-40B (manufactured by Rion Co., Ltd.) (the measurement was made on the day when the composition was prepared, for one portion and after 3 months storage at room temperature, for another portion.

Synthesis Example

Into a vessel for preparation of monomers solution, containing a nitrogen atmosphere were fed 61.0 kg of methyl ethyl ketone (hereinafter, abbreviated to "MEK"), 13.3 kg of α-methacryloyloxy-γ-butyrolactone (hereinafter, abbreviated to "GBLM"), 19.7 kg of 2-methyl-2-adamantyl methacrylate (hereinafter, abbreviated to "MAM") and 9.0 kg of 3-hydroxy-1-adamantyl methacrylate (hereinafter, abbreviated to "HAM"), followed by stirring at 20 to 25° C. to prepare a monomers solution. Into other vessel containing a nitrogen atmosphere were fed 11.0 kg of MEK and 1.1 kg of azobisisobutyronitrile, followed by stirring at 10 to 20° C. for dissolution, to prepare an initiator solution. 25.0 kg of MEK was fed into a polymerization vessel containing a nitrogen atmosphere and heated to 80° C. with stirring. There was started simultaneous feeding, into the polymerization vessel maintained at 80° C., of the initiator solution maintained at room temperature (about 20° C.) and the monomers solution heated to 25 to 30° C. The feeding of the two solutions was made in 4 hours at respective given rates. After completion of the feeding, aging was conducted for 2 hours with the polymerization temperature being maintained at 80° C. Then, the polymerization mixture was cooled to room temperature and taken out. The polymerization mixture obtained was dropped into 700 kg of methanol containing 5% by weight of water, to precipitate a polymer. The polymer was filtered to obtain a wet cake. The wet cake was washed with 700 kg of methanol containing 5% by weight of water and filtered. This operation was conducted twice. Part of the wet cake obtained was taken as a sample and dried by a vacuum drier to obtain a white powder. The white powder was analyzed by $^{13}$C-NMR and GPC. The copolymer composition determined by $^{13}$C-NMR was GBLM/MAM/HAM=40/41/19. The Mw and Mw/Mn determined by GPC was 10,400 and 1.85, respectively. The remaining wet cake was re-dissolved in MEK to prepare a MEK solution containing 10% by weight of a copolymer.

Example 1

The MEK solution obtained in the above Synthesis Example was passed through Zeta Plus 020 GN (a product of Cuno K.K.; a filter of 0.2 μm in nominal pore diameter, obtained by loading, on a fiber, a resin having a positive zeta-potential, together with a filtering aid such as diatomaceous earth, cellulose or the like). While the resulting MEK solution was being heated under reduced pressure to distil off MEK, PGMEA was added thereto, to prepare a PGMEA solution containing 15% by weight of a copolymer. The number of particles in the PGMEA solution was measured according to the measurement method for the number of particles in resist composition, described in the above (3). The result is shown in Table 1.

Example 2

While the MEK solution obtained in the above Synthesis Example was being heated under reduced pressure to distil off MEK, PGMEA was added thereto, to prepare a PGMEA solution containing 15% by weight of a copolymer. The resulting PGMEA solution was passed through Zeta Plus 020 GN (a product of Cuno K.K.). Then, the number of particles in the PGMEA solution was measured according to the measurement method for the number of particles in resist composition, described in the above (3). The result is shown in Table 1.

Example 3

There was conducted the same operation as in Example 2 except that the Zeta Plus 020 GN (a product of Cuno K.K.) was changed to Ultipleat P-nylon (a product of Nihon Pall Ltd., a nylon 66-made membrane filter of 0.04 μm in pore diameter). Then, the number of particles in the PGMEA solution was measured according to the measurement method for the number of particles in resist composition, described in the above (3). The result is shown in Table 1.

Example 4

There was conducted the same operation as in Example 2 except that the Zeta Plus 020 GN (a product of Cuno K.K.) was changed to Electropore EF (a product of Cuno K.K., a nylon 66-made membrane filter of 0.04 μm in pore diameter, having a positive zeta-potential). Then, the number of particles in the PGMEA solution was measured according to the measurement method for the number of particles in resist composition, described in the above (3). The result is shown in Table 1.

Example 5

The PGMEA solution obtained in Example 1 was passed through Ultipleat P-nylon (a product of Nihon Pall Ltd.). Then, the number of particles in the PGMEA solution was measured according to the measurement method for the number of particles in resist composition, described in the above (3). The result is shown in Table 1.

Example 6

The MEK solution obtained in the above Synthesis Example was passed through Electropore EF (a product of Cuno K.K.). While the resulting MEK solution was being heated under reduced pressure to distil off MEK, PGMEA was added thereto, to prepare a PGMEA solution containing 15% by weight of a copolymer. The resulting PGMEA solution was passed through Ultipleat P-nylon (a product of Nihon Pall Ltd.). Then, the number of particles in the PGMEA solution was measured according to the measurement method for the number of particles in resist composition, described in the above (3). The result is shown in Table 1.

Comparative Example 1

A PGMEA solution was prepared in the same manner as in Example 1 except that there was no passing through Zeta Plus 020 GN (a product of Cuno K.K.). Then, the number of particles in the PGMEA solution was measured according to the measurement method for the number of particles in resist composition, described in the above (3). The result is shown in Table 1.

Comparative Example 2

The PGMEA solution obtained in Comparative Example 1 was passed through Zeta Plus 020 GN (a product of Cuno K.K.). Then, the number of particles in the PGMEA solution was measured according to the measurement method for the number of particles in resist composition, described in the above (3). The result is shown in Table 1.

Comparative Example 3

A PGMEA solution was obtained in the same manner as in Comparative Example 2 except that the Zeta Plus 020 GN (a product of Cuno K.K.) was changed to Ultipleat P-nylon (a product of Nihon Pall Ltd.). Then, the number of particles in the PGMEA solution was measured according to the measurement method for the number of particles in resist composition, described in the above (3). The result is shown in Table 1.

Comparative Example 4

A PGMEA solution was obtained in the same manner as in Comparative Example 2 except that the Zeta Plus 020 GN (a product of Cuno K.K.) was changed to Electropore EF (a product of Cuno K.K.). Then, the number of particles in the PGMEA solution was measured according to the measurement method for the number of particles in resist composition, described in the above (3). The result is shown in Table 1.

Comparative Example 5

A PGMEA solution was obtained in the same manner as in Example 2 except that the Zeta Plus 020 GN (a product of Cuno K.K.) was changed to Optimizer D (a product of Nihon Microlysis). Then, the number of particles in the PGMEA solution was measured according to the measurement method for the number of particles in resist composition, described in the above (3). The result is shown in Table 1.

Comparative Example 6

A PGMEA solution was obtained in the same manner as in Example 2 except that the Zeta Plus 020 GN (a product of Cuno K.K.) was changed to Ion Clean AQ (a product of Nihon Pall Ltd., a membrane filter made of an ion exchange group-modified polyethylene, no nominal pore diameter given by maker). Then, the number of particles in the PGMEA solution was measured according to the measurement method for the number of particles in resist composition, described in the above (3). The result is shown in Table 1.

TABLE 1

| | Copolymer composition | | Resist composition | | Number of particles | |
|---|---|---|---|---|---|---|
| | Filter before solvent substitution | Filter after solvent substitution | Filter | Filter at measurement | When prepared | 3 months later |
| Example 1 | 020 | — | — | UPE | <10 | 15 |
| Example 2 | — | 020 | — | UPE | <10 | 17 |
| Example 3 | — | N66 | — | UPE | <10 | 12 |
| Example 4 | — | EF | — | UPE | <10 | <10 |
| Example 5 | 020 | N66 | — | UPE | <10 | <10 |
| Example 6 | EF | N66 | — | UPE | <10 | <10 |
| Comparative Example 1 | — | — | — | UPE | <10 | 249 |
| Comparative Example 2 | — | — | 020 | UPE | <10 | 132 |
| Comparative Example 3 | — | — | N66 | UPE | <10 | 62 |
| Comparative Example 4 | — | — | EF | UPE | <10 | 43 |
| Comparative Example 5 | — | UPE | — | UPE | <10 | 186 |
| Comparative Example 6 | — | AQ | — | UPE | <10 | 112 |

020: Zeta Plus 020 GN (a product of Cuno K.K.)
UPE: Optimizer D (a product of Nihon Microlysis)
N66: Ultipleat P-nylon (a product of Nihon Pall Ltd.)
EF: Electropore EF (a product of Cuno K.K.)
AQ: Ion Clean AQ (a product of Nihon Pall Ltd.)
Filter at measurement: a filter used at the measurement of number of particles.

As is clear from the above Examples and Comparative Examples, in the copolymers for semiconductor resist, obtained by passing, through a filter containing a resin having amino group and/or amide bond, a copolymer solution for semiconductor resist which contains a copolymer for semiconductor resist having a polar-group-containing recurring unit and an alicyclic structure-containing recurring unit but contains no ionic additive, the number of particles of 0.2 µm or more in diameter after 3 months storage was 20 or less per ml, specifically 17 or less. The number of such particles was 10 or less per ml particularly when the filter containing a resin having amino group and/or amide bond was a filter having a positive zeta-potential and containing a polyamide resin (Example 4) and also when there were used two filters, i.e. a filter having a positive zeta-potential and a filter containing a polyamide resin.

In contrast, when the measurement of number of particles was made using no filter (Comparative Example 1) and when a copolymer composition was passed through a filter other than the filter containing a resin having amino group and/or amide bond (Comparative Examples 5 and 6), the number of particles of 0.2 µm or more in diameter after 3 months storage was 100 or more per ml. Also, when a resist composition containing an ionic additive was passed through a filter containing a resin having amino group and/or amide bond (Comparative Examples 2 to 4), the number of particles was large (40 or more).

INDUSTRIAL APPLICABILITY

According to the present invention, there can be provided a method for prevention of increase in particles in copolymer for semiconductor resist, capable of producing a copolymer for semiconductor resist which can be suitably used in a resist film used for formation of a fine pattern in semiconductor production and which is very low in formation of particles during storage and accordingly generates substantially no defect after development.

What is claimed is:

1. A method for preventing the generation over time of particles in a copolymer for semiconductor resist during storage, comprising the steps of:

providing a filter containing a resin having an amino group and/or an amide bond; and passing a copolymer solution for semiconductor resist through the filter, said copolymer solution containing a copolymer for semiconductor resist having a polar group-containing recurring unit and a recurring unit having an alicyclic structure and which contains no ionic additive.

2. A method for prevention of generation over time in particles in copolymer for semiconductor resist during storage, according to claim 1, wherein the filter containing a resin having an amino group and/or an amide bond is a filter having a positive zeta-potential.

3. A method for prevention of generation over time in particles in copolymer for semiconductor resist during storage, according to claim 1, wherein the filter containing a resin having an amino group and/or an amide bond is a filter containing a polyamide resin.

4. A method for prevention of generation over time in particles in copolymer for semiconductor resist during storage, according to claim 1, wherein the filter containing a resin having an amino group and/or an amide bond is a filter having a positive zeta-potential and containing a polyamide resin.

5. A method for preventing the generation over time of particles in copolymer for semiconductor resist during storage, which comprises subjecting a copolymer solution for semiconductor resist which contains a copolymer for semiconductor resist having a polar group-containing recurring unit and a recurring unit having an alicyclic structure and which contains no ionic additive, to:

a step of passing the copolymer solution through a filter having an amino group and/or an amide bond, and a step of passing the copolymer solution through a filter containing a polyamide resin.

6. A method for prevention of increase in particles in copolymer for semiconductor resist, according to claim 5, wherein the filter containing a resin having an amino group and/or an amide bond is a filter having a positive zeta-potential.

7. A method for prevention of generation over time in particles in copolymer for semiconductor resist during storage, according to claim 1, wherein the number of particles having pore diameters of 0.2 μm or more after three-month storage is 20 or less per ml.

8. A copolymer for semiconductor lithography, which is obtained by applying a method for prevention of generation over time in particles in copolymer for semiconductor resist during storage, set forth in claim 1.

9. A composition for semiconductor resist, containing a copolymer for semiconductor lithography set forth in claim 8.

* * * * *